United States Patent
Hakenes et al.

(10) Patent No.: US 9,989,598 B2
(45) Date of Patent: Jun. 5, 2018

(54) METHOD FOR DYNAMIC NOISE REDUCTION OF MAGNETIC FIELD SENSOR SIGNALS AND A MAGNETIC FIELD SENSOR CIRCUIT WITH DYNAMIC NOISE REDUCTION

(71) Applicant: Micronas GmbH, Freiburg (DE)

(72) Inventors: Rolf Hakenes, Glottertal (DE); Stefan Keller, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 0 days. days.

(21) Appl. No.: 15/357,499

(22) Filed: Nov. 21, 2016

(65) Prior Publication Data

US 2017/0146614 A1 May 25, 2017

(30) Foreign Application Priority Data

Nov. 19, 2015 (DE) .................. 10 2015 014 952

(51) Int. Cl.
  *G01R 33/07* (2006.01)
  *G01R 33/00* (2006.01)
  *H03H 17/04* (2006.01)
(52) U.S. Cl.
  CPC ......... *G01R 33/0029* (2013.01); *G01R 33/07* (2013.01); *H03H 17/04* (2013.01)
(58) Field of Classification Search
  CPC ..... G01R 33/0029; G01R 33/07; H03H 17/04
  USPC ........................ 324/225, 251, 260
  See application file for complete search history.

(56) References Cited

U.S. PATENT DOCUMENTS

| | | | |
|---|---|---|---|
| 5,463,346 A * | 10/1995 | Brooks | H03H 11/04 327/553 |
| 9,297,891 B2 | 3/2016 | Karl | |
| 2015/0323612 A1* | 11/2015 | Latham | G01R 33/096 324/251 |

FOREIGN PATENT DOCUMENTS

| | | |
|---|---|---|
| DE | 26 25 964 A1 | 12/1977 |
| DE | 101 38 640 C1 | 1/2003 |
| DE | 10 2009 027 842 A1 | 1/2011 |

(Continued)

OTHER PUBLICATIONS

Carsten Roppel, *Grundlagen der digitalen Kommunikationstechnik (Basics of Digital Communications Technology)*, Specialist Publishing Co., pp. 268-277 (2006).

(Continued)

*Primary Examiner* — Jay Patidar
(74) *Attorney, Agent, or Firm* — Muncy, Geissler, Olds & Lowe, P.C.

(57) ABSTRACT

A method for dynamic noise reduction of magnetic field sensor signals of a magnetic field sensor circuit with a magnetic field sensor and a switching device, wherein the magnetic field sensor provides a sensor signal to a sensor output, and wherein the switching device comprises a signal comparator, a low pass filter and a multiplexer, and wherein the switching device comprises a signal input interconnected with the sensor signal output and a signal output, and wherein the signal comparator has a first input interconnected with the signal input and a second input interconnected with the low pass filter, and a control signal output interconnected with the multiplexer. In a first method step, the sensor signal is compared to the level of a signal of the low pass filter by means of the signal comparator, and the result is compared to a predetermined threshold value.

15 Claims, 1 Drawing Sheet

(56) References Cited

FOREIGN PATENT DOCUMENTS

DE  10 2004 064 185 B4  4/2013

OTHER PUBLICATIONS

Carsten Roppel, "Realisierung digitaler Filger in C (Implementation of Digital Filters in C)" from *Grundlagen der digitalen Kommunikationstechnik,* Specialist Pub. Co., pp. 1-16 (2006).
Rudolf F. Graf, *Converter and Filter Circuits,* ISBN: 978-0-08-050313-4, p. 57 (1996).

* cited by examiner

METHOD FOR DYNAMIC NOISE REDUCTION OF MAGNETIC FIELD SENSOR SIGNALS AND A MAGNETIC FIELD SENSOR CIRCUIT WITH DYNAMIC NOISE REDUCTION

This nonprovisional application claims priority under 35 U.S.C. § 119(a) to German Patent Application No. 10 2015 014 952.0, which was filed in Germany on Nov. 19, 2015, and which is herein incorporated by reference.

BACKGROUND OF THE INVENTION

Field of the Invention

The invention relates to a method for dynamic noise reduction of magnetic field sensor signals and a magnetic field sensor circuit with dynamic noise reduction.

Description of the Background Art

From U.S. Pat. No. 5,463,346, a low pass filter circuit which switches between a slow and a fast filter is known. From DE 10 2009 027842 A1 (which corresponds to U.S. Pat. No. 9,297,891), DE 101 38 640 C1 and DE 10 2004 064 185 B4, sensor circuits are known, wherein in particular by means of low pass filtering, noise reduction is achieved.

From C. Roppel, Grundlagen der digitalen Kommunikationstechnik [Basics of Digital Communications Technology], specialist publishing company Leipzig, 2006, http://www.hanser-fachbuch.de/9783446228573 ISBN: 978-3-446-22857-3, and accompanying materials, digital low pass filter circuits are known. Furthermore, from the accompanying material to the book "Realisierung digitaler Filter in C" [Implementation of Digital Filters in C] by C. Roppel, found under https://www.google.de on Nov. 19, 2009, software programs for programming low pass filters are known.

Also, from Rudolf F. Graf, Converter and Filter Circuits, 1996, ISBN: 978-0-08-050313-4, p. 57, further filter circuits known.

SUMMARY OF THE INVENTION

It is therefore an object of the invention to provide a method and an apparatus which respectively further develop the prior art.

According to an exemplary embodiment of the invention, a method for dynamic noise reduction of magnetic field sensor signals of a magnetic field sensor circuit having a magnetic field sensor and a switching device is provided, wherein the magnetic field sensor provides a sensor signal to a sensor output, wherein the switching device comprises a signal comparator, a low pass filter and a multiplexer.

The switching device has a signal input interconnected with the sensor signal output and a signal output, and the signal comparator has a first input interconnected with the signal input and a second input interconnected with the low pass filter and a control signal output interconnected with the multiplexer, and wherein the multiplexer has a first input connected to the signal input and a second input interconnected with the output of the low pass filter and an output interconnected with the signal output.

Here, in a first method step, by means of the signal comparator, the sensor signal is compared to the level of a signal of the low pass filter, and in a second method step, the result of the first method step is compared to a predetermined threshold value, provided the result exceeds the predetermined threshold value, a switchover is made by means of the control signal of the multiplexer so that at the signal output, preferably interconnection takes place directly with the sensor signal and, if the comparison result falls below the predetermined threshold value, a switchover is made by means of the control signal of the multiplexers so that the output of the multiplexer is interconnected with the output of the low pass filter.

In an embodiment of the invention, a magnetic field sensor circuit for dynamic noise reduction is provided, comprising a magnetic field sensor and a switching device, wherein the magnetic field sensor provides a sensor signal to a sensor output, and wherein the switching device comprises a signal comparator, a low pass filter and a multiplexer.

The switching device comprises a signal input interconnected with the sensor signal output and a signal output. The signal comparator has a first input interconnected with the signal input and a second input interconnected with the low pass filter and a control signal output interconnected with the multiplexer.

The multiplexer has a first input connected to the signal input and a second signal input interconnected with the output of the low pass filter and an output interconnected with the signal output, wherein based on a comparison of the signals present at the two inputs carried out in the signal comparator, the signal output of the multiplexer is interconnected with either the signal input or with the output of the low pass filter.

It should be noted that such a magnetic field sensor circuit can be used to detect changes in position of a sensor. In this case, the sensor that is generally made of a ferromagnetic material causes a change in the magnetic flux by means of the magnetic field sensor of the magnetic field sensor circuit. In an alternative embodiment, the sensor includes a permanent magnet. When the strength of the magnetic flux at the location of the magnetic field sensor changes, the sensor signal of the magnetic field sensor also changes. It can be understood that with rapid changes of the magnetic flux, the amplitude of the sensor signal also rapidly changes. The term "rapid" hereby can be understood to mean variations in time within the range of a few ms. Through the use of the low pass filter for noise reduction, the reaction times to rapid changes are slowed considerably, i.e., the output signal of the magnetic field sensor circuit follows only in a delayed manner. It is advantageous to use the magnetic field sensor circuit for performing the method.

An advantage of the inventive method and the magnetic field sensor circuit is that on the one hand, noise reduction can be performed by means of a low pass filter, thereby reliably detecting even small signal amplitudes, and on the other hand, during rapid changes of the sensor signal, i.e., during dynamic processes, by using a signal comparator, the signal processing is bypassed by means of the low pass filter. In other words, a bypass is created in the signal path to increase the dynamics of the magnetic field sensor circuit for rapid changes.

In an embodiment, by means of the signal comparator, the signal present at the second input of the signal comparator is subtracted from the signal present at the first input of the signal comparator. Subsequently, the amount of the difference of the two signals is compared to the predetermined threshold value. Preferably, the threshold value can be adjusted.

In an embodiment, the low pass fitter is formed as a recursive (IIR) filter. Preferably, the low pass filter or the switching device is formed as a digital circuit, in particular within a digital signal processor.

In an embodiment, the signal of the signal output is present at the second signal input of the signal comparator during the first method step by means of a delay element looped between the signal output and a second multiplier.

In an embodiment, the input signal is multiplied by a factor of 1/d by means of the first multiplier and the delayed signal of the signal output is multiplied by the factor 1−1/d with the second multiplier and then, the two signals of the multipliers are summed by means of an adder and are present at the second input of the multiplexer. It should be noted that the range of values for the number d includes all real numbers. It is understood that the factor 1/d is also known as a coefficient and that the dynamics of the low pass filter can be adjusted according to the size of the coefficient.

It can be advantageous for the bandwidth of the low pass filter to be increased as long as the amount of the difference is above the threshold signal, in order to shift a switching of the multiplexer. To this end, it is possible to change the coefficients of the low pass filter. It is understood that with a digital implementation of the low pass filter, it is particularly easy to change the coefficients, especially when the low pass filter is realized by means of a software program within a digital signal processor. In a further embodiment, the size of the thresholds can be changed.

In another embodiment, a linear weighting of the result of the comparison of the signals present at the two inputs is carried out before the result is compared to the threshold value. One advantage is that not only the extent of the amount of the difference between the two input signals is assessed, but that also the size of the two signals can be evaluated.

In a further embodiment, provided that in the comparison of the amount of the difference between the sensor signal and a signal of the low pass filter exceeds a predetermined threshold, the signal output of the multiplexer is interconnected with the signal input, or if the amount of the difference falls below the threshold, the signal output is interconnected with the output of the low pass filter.

Further, it is advantageous if the low pass filter has a control input and the control input is interconnected with the control output of the signal comparator.

In an embodiment, the low pass fitter has a looped first multiplier between the signal input and an adder. Furthermore, the filter comprises a second multiplier looped between the adder and a delay element. Also, the second multiplier and the delay element are interconnected with the second input of the signal comparator, and the delay element is interconnected with the signal output.

In an embodiment, the magnetic field sensor is a Hall sensor, particularly designed as a Hall plate. Here, a plurality of sensors can be used for different components of the magnetic field, each sensor preferably having an associated signal path.

In an embodiment, the multiplexer is configured as a single multiplexer. Preferably, the multiplexer is interconnected with a signal amplifier.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
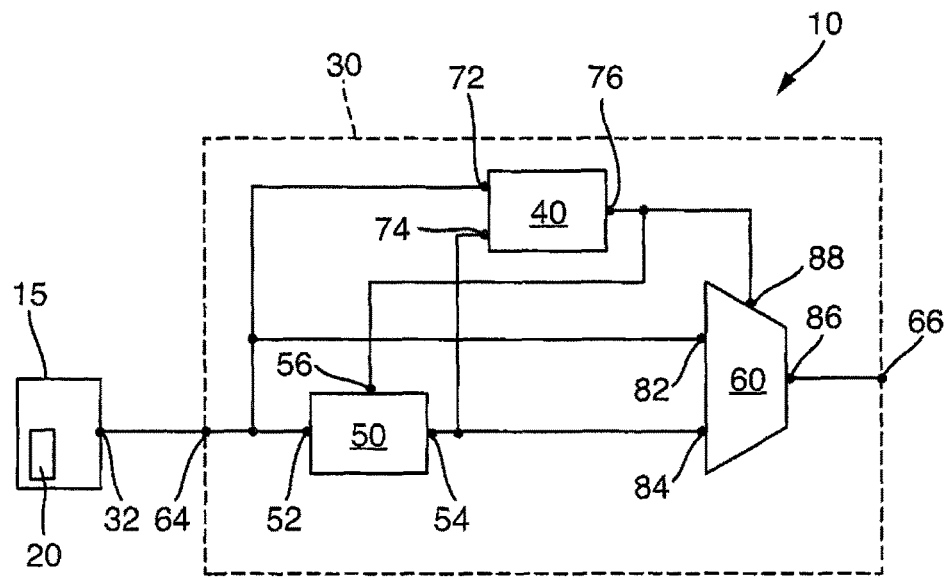
FIG. 1 is a schematic view of a first embodiment according to the invention.

The illustration of FIG. 1 shows a schematic view of a first embodiment of a magnetic field sensor circuit 10. The magnetic field sensor circuit 10 includes a magnetic field sensor unit 15 with a magnetic field sensor 20 and a switching device 30. The magnetic field sensor unit 15 provides the signal of the magnetic field sensor 20 to a sensor signal output 32.

The switching device 30 comprises a signal comparator 40, a low pass filter 50 having an input 52, an output 54 and a terminal 56, and a multiplexer 60. The switching device 30 has a signal input 64 interconnected with a sensor signal output 32 and a signal output 66.

The signal comparator 40 has a first input 72 interconnected with the signal input 64 and a second input 74 interconnected with the low pass filter 50 and a control signal output 76 interconnected with the multiplexer 60.

The multiplexer 60 includes a first input 82 connected to the signal input 64 and a second input 84 interconnected with the output 54 of the low pass filter 50 and an output 86 interconnected with the signal output 66 and a control input 88 interconnected with the control signal output 76.

Based on the comparison performed in the signal comparator 40, the output 86 of the multiplexer 60 is interconnected either with the signal input 64 or with the output 54 of the low pass filter 50.

During the comparison, a difference between the sensor signal at the signal input 64 and a signal at the output 54 of the low pass filter 50 is formed in the signal comparator 40. If the amount of the difference exceeds a predetermined threshold, the output 86 of the multiplexer 60 is interconnected with the signal input 64 or if the amount of the difference falls below the threshold, the output 86 is interconnected with the output 54 of the low pass filter 50. For switching the multiplexer 60, the control signal is preferably varied at the control signal output 76 by the signal comparator 40.

Preferably, the multiplexer 60 is designed as a so-called simple multiplexer. Furthermore, it is preferable to design the magnetic field sensor as a Hall sensor, in particular as a Hall plate.

Figure 2:
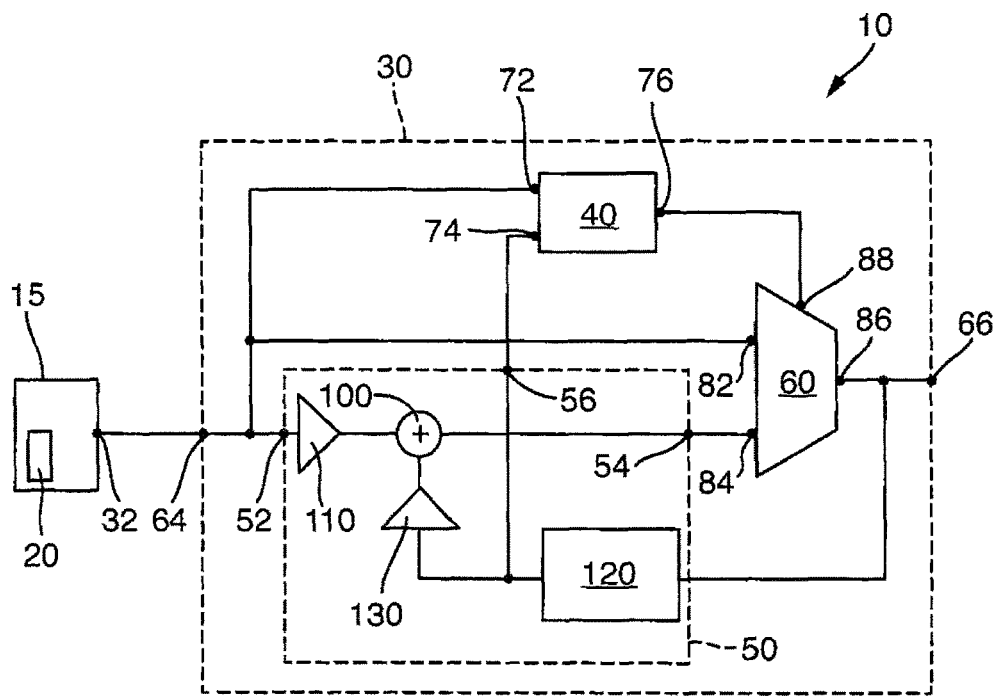
FIG. 2 is a schematic view of a second embodiment according to the invention.

In the illustration of FIG. 2, a second embodiment is shown. Below, only the differences from the illustration in FIG. 1 will be explained. In the present case, the low pass 50 is formed as a recursive (IIR) filter. The low pass 50 has a first multiplier 110 looped between the signal input 62 and an adder 100. Furthermore, the low pass 50 comprises a second multiplier 130 looped between the adder 100 and a delay element 120. The second multiplier 130 and the delay element 120 are both interconnected with the second input 74 of the signal comparator 40. The delay element 120 is also interconnected with the output 86 of the multiplexer 60.

It is understood that in particular the switching device 30 can be designed as a digital circuit within a digital signal processor—not shown.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for dynamic noise reduction of magnetic field sensor signals of a magnetic field sensor circuit with a magnetic field sensor and a switching device, the method comprising:
   providing, via the magnetic field sensor, a sensor signal to a sensor signal output;
   providing the switching device with a signal comparator, a low pass filter, and a multiplexer, the switching device having a signal input interconnected with the sensor signal output and a signal output, the signal comparator having a first input interconnected with the signal input and a second input interconnected with the low pass filter output and a control signal output interconnected with the multiplexer, the multiplexer having a first input interconnected with the signal input and a second input interconnected with the output of the low pass filter and an output interconnected with the signal output;
   comparing the sensor signal to the output signal of the low pass filter via the signal comparator;
   comparing the result to a predetermined threshold value; and
   performing, provided that the result exceeds the predetermined threshold value, a switchover via the control signal of the multiplexers so that the signal output is interconnected with the sensor signal, and if the result of the comparison is less than the predetermined threshold value, a switchover is performed via the control signal of the multiplexers so that the signal output is interconnected with the output of the low pass filter.

2. The method for dynamic noise reduction according to claim 1, wherein, via the signal comparator, the signal present at the second input of the signal comparator is subtracted from the signal present at the first input of the signal comparator and then the amount of the difference of the two signals is compared to the predetermined threshold value.

3. The method for dynamic noise reduction according to claim 1, wherein the low pass filter is a recursive filter.

4. The method for dynamic noise reduction according to claim 1, wherein the signal of the signal output is applied to the second input of the signal comparator via a delay element looped between the signal output and a second multiplier.

5. The method for dynamic noise reduction according to claim 1, wherein, via a first multiplier, the input signal is multiplied by a factor of 1/d, wherein d includes all real numbers, and via a second multiplier, the delayed signal of the signal output is multiplied by a factor 1−1/d, and wherein the two signals of the first and second multipliers are summed by an adder and are applied to the second input of the multiplexer.

6. The method for dynamic noise reduction according to claim 1, wherein the bandwidth of the low pass filter is increased, provided that an amount of a difference is above the predetermined threshold value, in order to shift a switching of the multiplexer.

7. The method for dynamic noise reduction according to claim 1, wherein a value of the predetermined threshold value is changed.

8. The method for dynamic noise reduction according to claim 1, wherein a linear evaluation of the result of the comparison of the signals present at the two inputs is performed.

9. A magnetic field sensor circuit with dynamic noise reduction, comprising:
   a magnetic field sensor providing a sensor signal to a sensor signal output; and
   a switching device, comprising a signal comparator, a low pass filter, and a multiplexer,
   wherein the switching device has a signal input interconnected with the sensor signal output,
   wherein the signal comparator has a first input interconnected with the signal input and a second input interconnected with the low pass filter and a control signal output interconnected with the multiplexer, and
   wherein the multiplexer has a first input connected to the signal input and a second input interconnected with the output of the low pass filter and an output interconnected with the signal output,
   wherein, based on a comparison carried out in the signal comparator, the output of the multiplexer is interconnected with either the signal input or the output of the low pass filter.

10. The magnetic field sensor circuit according to claim 9, wherein, if during the comparison, the amount difference between the sensor signal and a signal of the low pass filter exceeds a predetermined threshold value, the output of the multiplexer is interconnected with the signal input, or if the amount difference is below the threshold value, the output of the multiplexer is interconnected with the output of the low pass filter.

11. The magnetic field sensor circuit according to claim 9, wherein the low pass filter has a control input and the control input is interconnected with the control output of the signal comparator.

12. The magnetic field sensor circuit according to claim 9, wherein the low pass filter is a recursive filter.

13. The magnetic field sensor circuit according to claim 9, wherein the low pass filter has a first multiplier looped between the signal input and an adder and the low pass filter comprises a second multiplier looped between the adder and a delay element, and
   wherein the delay element is interconnected between the second input of the signal comparator and the signal output.

14. The magnetic field sensor circuit according to claim 9, wherein the magnetic field sensor is a Hall sensor.

15. The magnetic field sensor circuit according to claim 9, wherein the multiplexer is a simple multiplexer.

* * * * *